(12) United States Patent
Man

(10) Patent No.: US 9,362,891 B2
(45) Date of Patent: Jun. 7, 2016

(54) METHODS AND APPARATUS FOR TUNING A COMMUNICATION DEVICE

(75) Inventor: Ying Tong Man, Waterloo (CA)

(73) Assignee: BLACKBERRY LIMITED, Waterloo, Ontario (CA)

( * ) Notice: Subject to any disclaimer, the term of this patent is extended or adjusted under 35 U.S.C. 154(b) by 294 days.

(21) Appl. No.: 13/558,716

(22) Filed: Jul. 26, 2012

(65) Prior Publication Data

US 2014/0030987 A1   Jan. 30, 2014

(51) Int. Cl.
  *H04B 1/40* (2015.01)
  *H03J 1/00* (2006.01)
  *H04B 1/3827* (2015.01)

(52) U.S. Cl.
  CPC ............ *H03J 1/0008* (2013.01); *H04B 1/3838* (2013.01); *H03J 2200/10* (2013.01)

(58) Field of Classification Search
  CPC ........... H04B 1/40; H04B 1/18; H04B 1/0458
  USPC ............ 455/77, 67.14, 120, 160, 82, 87, 123, 455/133; 333/17.3; 343/850
  See application file for complete search history.

(56) References Cited

U.S. PATENT DOCUMENTS

| | | |
|---|---|---|
| 2,745,067 A | 5/1956 | True |
| 3,117,279 A | 1/1964 | Ludvigson |
| 3,160,832 A | 12/1964 | Beitman |
| 3,390,337 A | 6/1968 | Beitman |
| 3,443,231 A | 5/1969 | Roza |
| 3,509,500 A | 4/1970 | McNair |
| 3,571,716 A | 3/1971 | Hill |
| 3,590,385 A | 6/1971 | Sabo |
| 3,601,717 A | 8/1971 | Kuecken |
| 3,794,941 A | 2/1974 | Templin |
| 3,919,644 A | 11/1975 | Smolka |
| 3,990,024 A | 11/1976 | Hou |

(Continued)

FOREIGN PATENT DOCUMENTS

| | | |
|---|---|---|
| CN | 101640949 A | 2/2010 |
| DE | 19614655 | 10/1997 |

(Continued)

OTHER PUBLICATIONS

Bezooijen, A. et al., "A GSM/EDGE/WCDMA Adaptive Series-LC Matching Network Using RF-MEMS Switches", IEE Journal of Solid-State Circuits, vol. 43, No. 10, Oct. 2088, 2259-2268.

(Continued)

*Primary Examiner* — Nay A. Maung
*Assistant Examiner* — Angelica M Perez
(74) *Attorney, Agent, or Firm* — Guntin & Gust, PLC; Ralph Trementozzi

(57) ABSTRACT

A system that incorporates teachings of the subject disclosure may include, for example, method for initiating a mode of operation of a communication device, measuring a signal to determine an adverse operational effect on the communication device, determining a tuning state from the signal to compensate for the adverse operational effect, tuning a circuit of the communication device having a variable reactance according to the tuning state, storing the tuning state in a memory of the communication device, and tuning the circuit according to the tuning state retrieved from the memory responsive to detecting a reoccurrence of the mode of operation of the communication device. Other embodiments are disclosed.

24 Claims, 7 Drawing Sheets

(56) References Cited

U.S. PATENT DOCUMENTS

| | | | |
|---|---|---|---|
| 3,995,237 | A | 11/1976 | Brunner |
| 4,186,359 | A | 1/1980 | Kaegebein |
| 4,201,960 | A | 5/1980 | Skutta |
| 4,227,256 | A | 10/1980 | O'Keefe |
| 4,383,441 | A | 5/1983 | Willis |
| 4,476,578 | A | 10/1984 | Gaudin |
| 4,493,112 | A | 1/1985 | Bruene |
| 4,509,019 | A | 4/1985 | Banu et al. |
| 4,777,490 | A | 10/1988 | Sharma |
| 4,799,066 | A | 1/1989 | Deacon |
| 4,965,607 | A | 10/1990 | Wilkins |
| 4,980,656 | A | 12/1990 | Duffalo |
| 5,032,805 | A | 7/1991 | Elmer |
| 5,142,255 | A | 8/1992 | Chang |
| 5,177,670 | A | 1/1993 | Shinohara |
| 5,195,045 | A | 3/1993 | Keane |
| 5,200,826 | A | 4/1993 | Seong |
| 5,212,463 | A | 5/1993 | Babbitt |
| 5,230,091 | A * | 7/1993 | Vaisanen ............... 455/88 |
| 5,243,358 | A | 9/1993 | Sanford |
| 5,258,728 | A | 11/1993 | Taniyoshi |
| 5,276,912 | A | 1/1994 | Siwiak |
| 5,301,358 | A | 4/1994 | Gaskill |
| 5,307,033 | A | 4/1994 | Koscica |
| 5,310,358 | A | 5/1994 | Johnson |
| 5,312,790 | A | 5/1994 | Sengupta |
| 5,334,958 | A | 8/1994 | Babbitt |
| 5,361,403 | A | 11/1994 | Dent |
| 5,371,473 | A | 12/1994 | Trinh |
| 5,409,889 | A | 4/1995 | Das |
| 5,427,988 | A | 6/1995 | Sengupta |
| 5,430,417 | A | 7/1995 | Martin |
| 5,446,447 | A | 8/1995 | Carney |
| 5,448,252 | A | 9/1995 | Ali |
| 5,451,567 | A | 9/1995 | Das |
| 5,451,914 | A | 9/1995 | Stengel |
| 5,457,394 | A | 10/1995 | McEwan |
| 5,472,935 | A | 12/1995 | Yandrofski |
| 5,479,139 | A | 12/1995 | Koscica |
| 5,486,491 | A | 1/1996 | Sengupta |
| 5,496,795 | A | 3/1996 | Das |
| 5,502,372 | A | 3/1996 | Quan |
| 5,524,281 | A | 6/1996 | Bradley |
| 5,548,837 | A | 8/1996 | Hess et al. |
| 5,561,407 | A | 10/1996 | Koscica |
| 5,564,086 | A | 10/1996 | Cygan |
| 5,589,844 | A | 12/1996 | Belcher et al. |
| 5,593,495 | A | 1/1997 | Masuda |
| 5,635,433 | A | 6/1997 | Sengupta |
| 5,635,434 | A | 6/1997 | Sengupta |
| 5,640,042 | A | 6/1997 | Koscica |
| 5,679,624 | A | 10/1997 | Das |
| 5,689,219 | A | 11/1997 | Piirainen |
| 5,693,429 | A | 12/1997 | Sengupta |
| 5,694,134 | A | 12/1997 | Barnes |
| 5,699,071 | A | 12/1997 | Urakami |
| 5,721,194 | A | 2/1998 | Yandrofski |
| 5,766,697 | A | 6/1998 | Sengupta |
| 5,777,581 | A | 7/1998 | Lilly |
| 5,778,308 | A | 7/1998 | Sroka |
| 5,786,727 | A | 7/1998 | Sigmon |
| 5,812,572 | A | 9/1998 | King |
| 5,812,943 | A | 9/1998 | Suzuki |
| 5,830,591 | A | 11/1998 | Sengupta |
| 5,846,893 | A | 12/1998 | Sengupta |
| 5,874,926 | A | 2/1999 | Tsuru |
| 5,880,635 | A | 3/1999 | Satoh |
| 5,886,867 | A | 3/1999 | Chivukula |
| 5,892,482 | A | 4/1999 | Coleman et al. |
| 5,929,717 | A | 7/1999 | Richardson |
| 5,940,030 | A | 8/1999 | Hampel et al. |
| 5,963,871 | A | 10/1999 | Zhinong |
| 5,969,582 | A | 10/1999 | Boesch |
| 5,982,099 | A | 11/1999 | Barnes et al. |
| 5,990,766 | A | 11/1999 | Zhang |
| 6,009,124 | A | 12/1999 | Smith |
| 6,020,787 | A | 2/2000 | Kim |
| 6,020,795 | A | 2/2000 | Kim |
| 6,029,075 | A | 2/2000 | Das |
| 6,045,932 | A | 4/2000 | Jia |
| 6,061,025 | A | 5/2000 | Jackson |
| 6,064,865 | A | 5/2000 | Kuo et al. |
| 6,074,971 | A | 6/2000 | Chiu |
| 6,096,127 | A | 8/2000 | Dimos |
| 6,100,733 | A | 8/2000 | Dortu |
| 6,101,102 | A | 8/2000 | Brand |
| 6,115,585 | A | 9/2000 | Matero |
| 6,125,266 | A | 9/2000 | Matero et al. |
| 6,133,883 | A | 10/2000 | Munson |
| 6,172,385 | B1 | 1/2001 | Duncombe |
| 6,215,644 | B1 | 4/2001 | Dhuler |
| 6,242,989 | B1 | 6/2001 | Barber |
| 6,266,528 | B1 | 7/2001 | Farzaneh |
| 6,281,748 | B1 | 8/2001 | Klomsdorf et al. |
| 6,281,847 | B1 | 8/2001 | Lee |
| 6,343,208 | B1 | 1/2002 | Ying |
| 6,377,142 | B1 | 4/2002 | Chiu |
| 6,377,217 | B1 | 4/2002 | Zhu |
| 6,377,440 | B1 | 4/2002 | Zhu |
| 6,384,785 | B1 | 5/2002 | Kamogawa |
| 6,404,614 | B1 | 6/2002 | Zhu |
| 6,408,190 | B1 | 6/2002 | Ying |
| 6,414,562 | B1 | 7/2002 | Bouisse |
| 6,415,562 | B1 | 7/2002 | Donaghue |
| 6,452,776 | B1 | 9/2002 | Chakravorty |
| 6,461,930 | B2 | 10/2002 | Akram |
| 6,466,774 | B1 | 10/2002 | Okabe |
| 6,492,883 | B2 | 12/2002 | Liang |
| 6,514,895 | B1 | 2/2003 | Chiu |
| 6,525,630 | B1 | 2/2003 | Zhu |
| 6,531,936 | B1 | 3/2003 | Chiu |
| 6,535,076 | B2 | 3/2003 | Partridge |
| 6,535,722 | B1 | 3/2003 | Rosen |
| 6,538,603 | B1 | 3/2003 | Chen |
| 6,556,102 | B1 | 4/2003 | Sengupta |
| 6,556,814 | B1 | 4/2003 | Klomsdorf |
| 6,570,462 | B2 | 5/2003 | Edmonson |
| 6,590,468 | B2 | 7/2003 | du Toit |
| 6,590,541 | B1 | 7/2003 | Schultze |
| 6,597,265 | B2 | 7/2003 | Liang |
| 6,608,603 | B2 | 8/2003 | Alexopoulos |
| 6,624,786 | B2 | 9/2003 | Boyle |
| 6,640,085 | B1 | 10/2003 | Chatzipetros |
| 6,657,595 | B1 | 12/2003 | Phillips |
| 6,661,638 | B2 | 12/2003 | Jackson |
| 6,670,256 | B2 | 12/2003 | Yang |
| 6,710,651 | B2 | 3/2004 | Forrester |
| 6,724,611 | B1 | 4/2004 | Mosley |
| 6,724,890 | B1 | 4/2004 | Bareis |
| 6,737,179 | B2 | 5/2004 | Sengupta |
| 6,747,522 | B2 | 6/2004 | Pietruszynski et al. |
| 6,759,918 | B2 | 7/2004 | Du Toit |
| 6,765,540 | B2 | 7/2004 | Toncich |
| 6,768,472 | B2 | 7/2004 | Alexopoulos |
| 6,774,077 | B2 | 8/2004 | Sengupta |
| 6,795,712 | B1 | 9/2004 | Vakilian |
| 6,825,818 | B2 | 11/2004 | Toncich |
| 6,839,028 | B2 | 1/2005 | Lee |
| 6,845,126 | B2 | 1/2005 | Dent |
| 6,859,104 | B2 | 2/2005 | Toncich |
| 6,862,432 | B1 | 3/2005 | Kim |
| 6,864,757 | B2 | 3/2005 | Du Toit |
| 6,868,260 | B2 | 3/2005 | Jagielski |
| 6,882,245 | B2 | 4/2005 | Utsunomiya |
| 6,888,714 | B2 | 5/2005 | Shaw |
| 6,905,989 | B2 | 6/2005 | Ellis |
| 6,906,653 | B2 | 6/2005 | Uno |
| 6,907,234 | B2 | 6/2005 | Karr |
| 6,920,315 | B1 | 7/2005 | Wilcox et al. |
| 6,943,078 | B1 | 9/2005 | Zheng |
| 6,946,847 | B2 | 9/2005 | Nishimori |
| 6,949,442 | B2 | 9/2005 | Barth |
| 6,961,368 | B2 | 11/2005 | Dent |
| 6,964,296 | B2 | 11/2005 | Memory |

(56) References Cited

U.S. PATENT DOCUMENTS

| | | |
|---|---|---|
| 6,965,837 B2 | 11/2005 | Vintola |
| 6,987,493 B2 | 1/2006 | Chen |
| 6,993,297 B2 | 1/2006 | Smith |
| 7,009,455 B2 | 3/2006 | Toncich |
| 7,071,776 B2 | 7/2006 | Forrester |
| 7,106,715 B1 | 9/2006 | Kelton |
| 7,107,033 B2 | 9/2006 | D du Toit |
| 7,113,614 B2 | 9/2006 | Rhoads |
| 7,151,411 B2 | 12/2006 | Martin |
| 7,176,634 B2 | 2/2007 | Kitamura |
| 7,176,845 B2 | 2/2007 | Fabrega-Sanchez |
| 7,180,467 B2 | 2/2007 | Fabrega-Sanchez |
| 7,221,327 B2 | 5/2007 | Toncich |
| 7,298,329 B2 | 11/2007 | Diament |
| 7,299,018 B2 | 11/2007 | Van Rumpt |
| 7,312,118 B2 | 12/2007 | Kiyotoshi |
| 7,332,980 B2 | 2/2008 | Zhu |
| 7,332,981 B2 | 2/2008 | Matsuno |
| 7,339,527 B2 | 3/2008 | Sager |
| 7,426,373 B2 | 9/2008 | Clingman |
| 7,427,949 B2 | 9/2008 | Channabasappa et al. |
| 7,453,405 B2 | 11/2008 | Nishikido et al. |
| 7,468,638 B1 | 12/2008 | Tsai |
| 7,469,129 B2 | 12/2008 | Blaker et al. |
| 7,528,674 B2 | 5/2009 | Kato et al. |
| 7,535,080 B2 | 5/2009 | Zeng et al. |
| 7,535,312 B2 | 5/2009 | McKinzie |
| 7,539,527 B2 | 5/2009 | Jang |
| 7,596,357 B2 | 9/2009 | Nakamata |
| 7,633,355 B2 | 12/2009 | Matsuo |
| 7,642,879 B2 | 1/2010 | Matsuno |
| 7,667,663 B2 | 2/2010 | Hsiao |
| 7,671,693 B2 * | 3/2010 | Brobston et al. ............ 333/17.3 |
| 7,705,692 B2 | 4/2010 | Fukamachi et al. |
| 7,711,337 B2 | 5/2010 | McKinzie |
| 7,714,676 B2 | 5/2010 | McKinzie |
| 7,714,678 B2 | 5/2010 | du Toit et al. |
| 7,728,693 B2 | 6/2010 | du Toit et al. |
| 7,760,699 B1 | 7/2010 | Malik |
| 7,768,400 B2 | 8/2010 | Lawrence et al. |
| 7,786,819 B2 | 8/2010 | Ella |
| 7,795,990 B2 | 9/2010 | du Toit |
| 7,830,320 B2 | 11/2010 | Shamblin et al. |
| 7,852,170 B2 | 12/2010 | McKinzie |
| 7,856,228 B2 | 12/2010 | Lekutai et al. |
| 7,865,154 B2 | 1/2011 | Mendolia |
| 7,907,094 B2 | 3/2011 | Kakitsu et al. |
| 7,917,104 B2 | 3/2011 | Manssen et al. |
| 7,949,309 B2 | 5/2011 | Rofougaran |
| 7,969,257 B2 | 6/2011 | du Toit |
| 7,983,615 B2 | 7/2011 | Bryce et al. |
| 7,991,363 B2 | 8/2011 | Greene |
| 8,112,043 B2 | 2/2012 | Knudsen et al. |
| 8,170,510 B2 | 5/2012 | Knudsen et al. |
| 8,190,109 B2 | 5/2012 | Ali et al. |
| 8,204,446 B2 | 6/2012 | Scheer |
| 8,217,731 B2 | 7/2012 | McKinzie et al. |
| 8,217,732 B2 | 7/2012 | McKinzie |
| 8,299,867 B2 | 10/2012 | McKinzie |
| 8,320,850 B1 | 11/2012 | Khlat |
| 8,325,097 B2 | 12/2012 | McKinzie, III et al. |
| 8,405,563 B2 | 3/2013 | McKinzie et al. |
| 8,421,548 B2 | 4/2013 | Spears et al. |
| 8,432,234 B2 | 4/2013 | Manssen et al. |
| 8,442,457 B2 | 5/2013 | Harel et al. |
| 8,457,569 B2 | 6/2013 | Blin |
| 8,472,888 B2 | 6/2013 | Manssen et al. |
| 8,543,176 B1 | 9/2013 | Daniel et al. |
| 8,558,633 B2 | 10/2013 | McKinzie, III |
| 8,564,381 B2 | 10/2013 | McKinzie |
| 8,594,584 B2 | 11/2013 | Greene et al. |
| 8,620,236 B2 | 12/2013 | Manssen et al. |
| 8,620,246 B2 | 12/2013 | McKinzie et al. |
| 8,620,247 B2 | 12/2013 | McKinzie et al. |
| 8,655,286 B2 | 2/2014 | Mendolia |
| 8,674,783 B2 | 3/2014 | Spears et al. |
| 8,680,934 B2 | 3/2014 | McKinzie et al. |
| 8,693,963 B2 | 4/2014 | du Toit et al. |
| 8,712,340 B2 | 4/2014 | Hoirup et al. |
| 8,787,845 B2 | 7/2014 | Manssen et al. |
| 8,957,742 B2 | 2/2015 | Spears et al. |
| 9,026,062 B2 * | 5/2015 | Manssen ............ H04B 1/0458 455/340 |
| 9,119,152 B2 | 8/2015 | Blin |
| 2002/0008672 A1 | 1/2002 | Gothard et al. |
| 2002/0030566 A1 | 3/2002 | Bozler |
| 2002/0079982 A1 | 6/2002 | Lafleur et al. |
| 2002/0109642 A1 | 8/2002 | Gee et al. |
| 2002/0118075 A1 | 8/2002 | Ohwada |
| 2002/0145483 A1 | 10/2002 | Bouisse |
| 2002/0167963 A1 | 11/2002 | Joa-Ng |
| 2002/0183013 A1 | 12/2002 | Auckland et al. |
| 2002/0187780 A1 | 12/2002 | Souissi |
| 2002/0191703 A1 | 12/2002 | Ling |
| 2002/0193088 A1 | 12/2002 | Jung |
| 2003/0060227 A1 | 3/2003 | Sekine |
| 2003/0071300 A1 | 4/2003 | Yashima |
| 2003/0114124 A1 | 6/2003 | Higuchi |
| 2003/0142022 A1 | 7/2003 | Ollikainen |
| 2003/0193997 A1 | 10/2003 | Dent |
| 2003/0199286 A1 | 10/2003 | D du Toit |
| 2003/0210206 A1 | 11/2003 | Phillips |
| 2003/0216150 A1 | 11/2003 | Ueda |
| 2003/0232607 A1 | 12/2003 | Le Bars |
| 2004/0009754 A1 | 1/2004 | Smith, Jr. et al. |
| 2004/0090372 A1 | 5/2004 | Nallo |
| 2004/0100341 A1 | 5/2004 | Luetzelschwab |
| 2004/0127178 A1 | 7/2004 | Kuffner |
| 2004/0137950 A1 | 7/2004 | Bolin |
| 2004/0202399 A1 | 10/2004 | Kochergin |
| 2004/0227176 A1 | 11/2004 | York |
| 2004/0232982 A1 | 11/2004 | Ichitsubo et al. |
| 2004/0257293 A1 | 12/2004 | Friedrich |
| 2004/0263411 A1 | 12/2004 | Fabrega-Sanchez et al. |
| 2005/0007291 A1 | 1/2005 | Fabrega-Sanchez |
| 2005/0032488 A1 | 2/2005 | Pehlke |
| 2005/0032541 A1 | 2/2005 | Wang |
| 2005/0042994 A1 | 2/2005 | Otaka |
| 2005/0059362 A1 | 3/2005 | Kalajo et al. |
| 2005/0082636 A1 | 4/2005 | Yashima |
| 2005/0085204 A1 | 4/2005 | Poilasne et al. |
| 2005/0093624 A1 | 5/2005 | Forrester et al. |
| 2005/0130608 A1 | 6/2005 | Forse |
| 2005/0130699 A1 | 6/2005 | Kim |
| 2005/0208960 A1 | 9/2005 | Hassan |
| 2005/0215204 A1 | 9/2005 | Wallace |
| 2005/0227627 A1 | 10/2005 | Cyr et al. |
| 2005/0227633 A1 | 10/2005 | Dunko |
| 2005/0259011 A1 | 11/2005 | Vance |
| 2005/0260962 A1 | 11/2005 | Nazrul et al. |
| 2005/0264455 A1 | 12/2005 | Talvitie |
| 2005/0280588 A1 | 12/2005 | Fujikawa et al. |
| 2005/0282503 A1 | 12/2005 | Onno |
| 2006/0003537 A1 | 1/2006 | Sinha |
| 2006/0009165 A1 | 1/2006 | Alles |
| 2006/0030277 A1 | 2/2006 | Cyr et al. |
| 2006/0077082 A1 | 4/2006 | Shanks et al. |
| 2006/0099915 A1 | 5/2006 | Laroia et al. |
| 2006/0119511 A1 | 6/2006 | Collinson et al. |
| 2006/0148415 A1 | 7/2006 | Hamalainen et al. |
| 2006/0160501 A1 | 7/2006 | Mendolia |
| 2006/0183431 A1 | 8/2006 | Chang et al. |
| 2006/0183433 A1 | 8/2006 | Mori et al. |
| 2006/0183442 A1 | 8/2006 | Chang et al. |
| 2006/0195161 A1 | 8/2006 | Li et al. |
| 2006/0205368 A1 | 9/2006 | Bustamante |
| 2006/0281423 A1 | 12/2006 | Caimi |
| 2007/0001924 A1 | 1/2007 | Hirabayashi et al. |
| 2007/0013483 A1 | 1/2007 | Stewart |
| 2007/0035458 A1 | 2/2007 | Ohba et al. |
| 2007/0042725 A1 | 2/2007 | Poilasne |
| 2007/0042734 A1 | 2/2007 | Ryu |
| 2007/0063788 A1 | 3/2007 | Zhu |
| 2007/0077956 A1 | 4/2007 | Julian et al. |

(56) References Cited

U.S. PATENT DOCUMENTS

| | | |
|---|---|---|
| 2007/0080888 A1 | 4/2007 | Mohamadi |
| 2007/0082611 A1 | 4/2007 | Terranova et al. |
| 2007/0085609 A1 | 4/2007 | Itkin et al. |
| 2007/0091006 A1 | 4/2007 | Thober et al. |
| 2007/0111681 A1 | 5/2007 | Alberth et al. |
| 2007/0142011 A1 | 6/2007 | Shatara |
| 2007/0142014 A1 | 6/2007 | Wilcox |
| 2007/0149146 A1 | 6/2007 | Hwang |
| 2007/0171879 A1 | 7/2007 | Bourque |
| 2007/0182636 A1 | 8/2007 | Carlson |
| 2007/0184825 A1 | 8/2007 | Lim et al. |
| 2007/0194859 A1 | 8/2007 | Brobston |
| 2007/0197180 A1 | 8/2007 | McKinzie et al. |
| 2007/0200766 A1 | 8/2007 | McKinzie |
| 2007/0200773 A1 | 8/2007 | Dou et al. |
| 2007/0248238 A1 | 10/2007 | Abreu et al. |
| 2007/0285326 A1 | 12/2007 | McKinzie |
| 2007/0293176 A1 | 12/2007 | Yu |
| 2008/0007478 A1 | 1/2008 | Jung |
| 2008/0018541 A1 | 1/2008 | Pang |
| 2008/0030165 A1 | 2/2008 | Lisac et al. |
| 2008/0055016 A1 | 3/2008 | Morris |
| 2008/0055168 A1 | 3/2008 | Massey et al. |
| 2008/0081670 A1 | 4/2008 | Rofougaran |
| 2008/0090539 A1 | 4/2008 | Thompson |
| 2008/0094149 A1 | 4/2008 | Brobston |
| 2008/0106350 A1 | 5/2008 | McKinzie |
| 2008/0122553 A1 | 5/2008 | McKinzie |
| 2008/0122723 A1 | 5/2008 | Rofougaran |
| 2008/0129612 A1 | 6/2008 | Wang |
| 2008/0158076 A1 | 7/2008 | Walley |
| 2008/0174508 A1 | 7/2008 | Iwai et al. |
| 2008/0261544 A1 | 10/2008 | Blin |
| 2008/0274706 A1 | 11/2008 | Blin et al. |
| 2008/0285729 A1 | 11/2008 | Glasgow et al. |
| 2008/0294718 A1 | 11/2008 | Okano |
| 2008/0300027 A1* | 12/2008 | Dou et al. ............... 455/574 |
| 2008/0305749 A1 | 12/2008 | Ben-Bassat |
| 2008/0305750 A1 | 12/2008 | Alon et al. |
| 2008/0309617 A1 | 12/2008 | Kong et al. |
| 2009/0002077 A1 | 1/2009 | Rohani et al. |
| 2009/0027286 A1 | 1/2009 | Ohishi |
| 2009/0039976 A1 | 2/2009 | McKinzie, III |
| 2009/0082017 A1 | 3/2009 | Chang et al. |
| 2009/0109880 A1 | 4/2009 | Kim et al. |
| 2009/0121963 A1 | 5/2009 | Greene |
| 2009/0149136 A1 | 6/2009 | Rofougaran |
| 2009/0180403 A1 | 7/2009 | Tudosoiu |
| 2009/0184879 A1 | 7/2009 | Derneryd |
| 2009/0215446 A1 | 8/2009 | Hapsari et al. |
| 2009/0231220 A1 | 9/2009 | Zhang et al. |
| 2009/0253385 A1 | 10/2009 | Dent et al. |
| 2009/0264065 A1 | 10/2009 | Song |
| 2009/0278685 A1 | 11/2009 | Potyrailo |
| 2009/0295651 A1 | 12/2009 | Dou et al. |
| 2009/0323572 A1 | 12/2009 | Shi et al. |
| 2009/0323582 A1 | 12/2009 | Proctor et al. |
| 2010/0041348 A1 | 2/2010 | Wilcox et al. |
| 2010/0053009 A1 | 3/2010 | Rofougaran |
| 2010/0060531 A1 | 3/2010 | Rappaport |
| 2010/0073103 A1 | 3/2010 | Spears et al. |
| 2010/0085260 A1 | 4/2010 | McKinzie |
| 2010/0085884 A1 | 4/2010 | Srinivasan et al. |
| 2010/0105425 A1 | 4/2010 | Asokan |
| 2010/0107067 A1 | 4/2010 | Vaisanen et al. |
| 2010/0134215 A1 | 6/2010 | Lee et al. |
| 2010/0156552 A1 | 6/2010 | McKinzie |
| 2010/0214189 A1 | 8/2010 | Kanazawa |
| 2010/0232474 A1 | 9/2010 | Rofougaran et al. |
| 2010/0244576 A1 | 9/2010 | Hillan et al. |
| 2010/0285836 A1 | 11/2010 | Horihata et al. |
| 2010/0302106 A1 | 12/2010 | Knudsen et al. |
| 2010/0304688 A1 | 12/2010 | Knudsen |
| 2011/0002080 A1 | 1/2011 | Ranta |
| 2011/0012790 A1 | 1/2011 | Badaruzzaman |
| 2011/0014879 A1 | 1/2011 | Alberth et al. |
| 2011/0043328 A1 | 2/2011 | Bassali |
| 2011/0086600 A1 | 4/2011 | Muhammad |
| 2011/0086630 A1 | 4/2011 | Manssen et al. |
| 2011/0102290 A1 | 5/2011 | Milosavljevic |
| 2011/0105023 A1 | 5/2011 | Scheer et al. |
| 2011/0116423 A1 | 5/2011 | Rousu et al. |
| 2011/0117863 A1 | 5/2011 | Camp, Jr. et al. |
| 2011/0117973 A1 | 5/2011 | Asrani et al. |
| 2011/0121079 A1 | 5/2011 | Lawrence et al. |
| 2011/0122040 A1 | 5/2011 | Wakabayashi et al. |
| 2011/0133994 A1 | 6/2011 | Korva |
| 2011/0140982 A1 | 6/2011 | Ozden et al. |
| 2011/0183628 A1 | 7/2011 | Baker |
| 2011/0183633 A1 | 7/2011 | Ohba et al. |
| 2011/0195679 A1 | 8/2011 | Lee et al. |
| 2011/0237207 A1 | 9/2011 | Bauder |
| 2011/0249760 A1 | 10/2011 | Chrisikos et al. |
| 2011/0256857 A1 | 10/2011 | Chen et al. |
| 2011/0281532 A1 | 11/2011 | Shin et al. |
| 2011/0299438 A1 | 12/2011 | Mikhemar et al. |
| 2011/0306310 A1 | 12/2011 | Bai |
| 2011/0309980 A1 | 12/2011 | Ali et al. |
| 2012/0051409 A1 | 3/2012 | Brobston et al. |
| 2012/0062431 A1 | 3/2012 | Tikka et al. |
| 2012/0075159 A1 | 3/2012 | Chang |
| 2012/0084537 A1 | 4/2012 | Indukuru et al. |
| 2012/0094708 A1 | 4/2012 | Park |
| 2012/0100802 A1 | 4/2012 | Mohebbi |
| 2012/0112851 A1 | 5/2012 | Manssen |
| 2012/0112852 A1 | 5/2012 | Manssen et al. |
| 2012/0119843 A1 | 5/2012 | du Toit et al. |
| 2012/0119844 A1 | 5/2012 | du Toit et al. |
| 2012/0214421 A1 | 8/2012 | Hoirup |
| 2012/0220243 A1 | 8/2012 | Mendolia |
| 2012/0243579 A1 | 9/2012 | Premakanthan et al. |
| 2012/0286586 A1 | 11/2012 | Balm |
| 2012/0293384 A1 | 11/2012 | Knudsen et al. |
| 2012/0295554 A1 | 11/2012 | Greene et al. |
| 2012/0295555 A1 | 11/2012 | Greene et al. |
| 2013/0005277 A1 | 1/2013 | Klomsdorf et al. |
| 2013/0052967 A1 | 2/2013 | Black et al. |
| 2013/0056841 A1 | 3/2013 | Hsieh et al. |
| 2013/0076579 A1 | 3/2013 | Zhang et al. |
| 2013/0076580 A1 | 3/2013 | Zhang et al. |
| 2013/0106332 A1 | 5/2013 | Williams et al. |
| 2013/0122829 A1 | 5/2013 | Hyvonen et al. |
| 2013/0137384 A1 | 5/2013 | Desclos et al. |
| 2013/0154897 A1 | 6/2013 | Sorensen et al. |
| 2013/0215846 A1 | 8/2013 | Yerrabommanahalli et al. |
| 2013/0293425 A1 | 11/2013 | Zhu et al. |
| 2013/0315285 A1* | 11/2013 | Black et al. ............... 375/219 |
| 2014/0002323 A1 | 1/2014 | Ali, Shirook M. et al. |

FOREIGN PATENT DOCUMENTS

| | | |
|---|---|---|
| DE | 102008050743 | 4/2010 |
| DE | 102009018648 A1 | 10/2010 |
| EM | EP0909024 | 4/1999 |
| EP | 0685936 | 6/1995 |
| EP | 0909024 | 4/1999 |
| EP | 1079296 | 2/2001 |
| EP | 1137192 | 9/2001 |
| EP | 1298810 | 4/2006 |
| EP | 2214085 A2 | 8/2010 |
| EP | 2328233 | 6/2011 |
| EP | 2388925 A1 | 11/2011 |
| EP | 2424119 A1 | 2/2012 |
| JP | 03276901 | 3/1990 |
| JP | 9321526 | 12/1997 |
| JP | 10209722 | 8/1998 |
| JP | 2005-130441 | 5/2005 |
| KR | 100645526 | 11/2006 |
| KR | 10-0740177 | 7/2007 |
| WO | 01/71846 | 9/2001 |
| WO | 2006/031170 | 3/2006 |
| WO | 2008/030165 | 3/2008 |
| WO | WO-2009/064968 | 5/2009 |
| WO | 2009/108391 A1 | 9/2009 |

(56) References Cited

FOREIGN PATENT DOCUMENTS

| WO | 2009/155966 | | 12/2009 |
|---|---|---|---|
| WO | 2010028521 A1 | | 3/2010 |
| WO | 2010121914 A1 | | 10/2010 |
| WO | WO-2011/044592 | | 4/2011 |
| WO | 2011102143 A1 | | 5/2011 |
| WO | 2011/084716 | | 7/2011 |
| WO | 2011084716 A1 | | 7/2011 |
| WO | WO-2011/133657 | | 10/2011 |
| WO | WO-2011028453 | | 10/2011 |
| WO | 2012/067622 | | 5/2012 |
| WO | 2012/085932 | | 6/2012 |
| WO | W)2012/085932 | * | 6/2012 |

OTHER PUBLICATIONS

Du Toit, , "Tunable Microwave Devices With Auto Adjusting Matching Circuit", U.S. Appl. No. 13/302,649, filed Nov. 22, 2011.
Du Toit, , "Tunable Microwave Devices With Auto-Adjusting Matching Circuit", U.S. Appl. No. 13/302,649, filed Nov. 22, 2011.
Greene, , "Method and Apparatus for Tuning a Communication Device", U.S. Appl. No. 13/108,463, filed May 16, 2011.
Greene, , "Method and Apparatus for Tuning a Communication Device", U.S. Appl. No. 13/108,589, filed May 16, 2011.
Hoirup, , "Method and Apparatus for Radio Antenna Frequency Tuning", U.S. Appl. No. 13/030,177, filed Feb. 18, 2011.
Huang, Libo et al., "Theoretical and experimental investigation of adaptive antenna impedance matching for multiband mobile phone applications", IEEE, Sep. 7, 2005, 13-17.
Ida, I. et al., "An Adaptive Impedence Matching System and Its Application to Mobile Antennas", TENCON 2004, IEEE Region 10 Conference, See Abstract ad p. 544, Nov. 21-24, 2004, 543-547.
Katsuya, K. , "Hybrid Integrated Circuit Device", Patent Abstracts of Japan, Publication No. 03-276901, Date of publication of application: Sep. 12, 1991.
Manssen, , "Method and Apparatus for Managing Interference in a Communication Device", U.S. Appl. No. 61/326,206, filed Apr. 20, 2010.
Manssen, , "Method and Apparatus for Tuning Antennas in a Communication Device", U.S. Appl. No. 12/941,972, filed Nov. 8, 2010.
Manssen, , "Method and Apparatus for Tuning Antennas in a Communication Device", U.S. Appl. No. 13/005,122, filed Jan. 12, 2011.
McKinzie, , "Adaptive Impedance Matching Module (AIMM) Control Architectures", U.S. Appl. No. 13/293,544, filed Nov. 10, 2011.
McKinzie, , "Adaptive Impedance Matching Module (AIMM) Control Architectures", U.S. Appl. No. 13/293,550, filed Nov. 10, 2011.
McKinzie, , "Method and Apparatus for Adaptive Impedance Matching", U.S. Appl. No. 13/217,748, filed Aug. 25, 2011.
Mendolia, , "Method and Apparatus for Turning a Communication Device", U.S. Appl. No. 13/035,417, filed Feb. 25, 2011.
Paratek Microwave, Inc., , "Method and Appartus for Tuning Antennas in a Communication Device", International Application No. PCT/US11/59620; Filed Nov. 7, 2011.
Patent Cooperation Treaty, , "International Search Report and Written Opinion", International Application No. PCT/US2010/046241, Mar. 2, 2011.
Patent Cooperation Treaty, , "International Search Report and Written Opinion", International Application No. PCT/US2010/056413, Jul. 27, 2011.
Patent Cooperation Treaty, , "International Search Report and Written Opinion", Nov. 16, 2011, International Application No. PCT/US/2011/038543.
Patent Cooperation Treaty, "International Search Report and Written Opinion", PCT Application No. PCT/US08/005085, Jul. 2, 2008.
Pervez, N.K. , "High Tunability barium strontium titanate thin films for RF circuit applications", Applied Physics Letters, 2004 American Institute of Physics, Nov. 2004.
Petit, Laurent , "MEMS-Switched Parasitic-Antenna Array for Radiation Pattern Diversity", IEEE Transactions on Antennas and Propagation, vol. 54, No. 9, Sep. 2009, 2624-2631.
Qiao, et al., "Antenna Impedance Mismatch Measurement and Correction for Adaptive COMA Transceivers", IEEE, 2005.
Qiao, et al., "Measurement of Antenna Load Impedance for Power Amplifiers", The Department of Electrical and Computer Engineering, University of California, San Diego, Sep. 13, 2004.
Spears, , "Methods for Tuning an Adaptive Impedance Matching Network With a Look-Up Table", U.S. Appl. No. 13/297,951, filed Nov. 16, 2011.
Stemmer, Susanne , "Low-loss tunable capacitors fabricated directly on gold bottom electrodes", University of California Postprints 2006.
Tombak, Ali , "Tunable Barium Strontium Titanate Thin Film Capacitors for RF and Microwave Applications", IEEE Microwave and Wireles Components Letters, vol. 12, Jan. 2002.
Zuo, S. , "Eigenmode Decoupling for Mimo Loop-Antenna Based on 180 Coupler", Progress In Electromagnetics Research Letters, vol. 26, 2011, 11-20.
Hyun, S., "Effects of strain on the dielectric properties of tunable dielectric SrTi03 thin films", Applied Physics Letters, vol. 79, No. 2, Jul. 9, 2001.
Payandehjoo, Kasra et al., "Investigation of Parasitic Elements for Coupling Reduction in MultiAntenna Hand-Set Devices", Published online Jan. 22, 2013 in Wiley Online Library (wileyonlinelibrary.com).
Taylor, T.R. , "Impact of thermal strain on the dielectric constant of sputtered barium strontium titanate thin films", Applied Physics Letters, vol. 80, No. 11, Mar. 18, 2002.
Xu, Hongtao, "Tunable Microwave Integrated Circuits using BST Thin Film Capacitors with Device", Integrated Ferroelectrics, Department of Electrical Engineering and Computer Engineering, University of California, 2005, Apr. 2005.

* cited by examiner

LOOK-UP TABLE

| |
|---|
| Band 1; Use Case 1; Desired tuning state |
| Band 1; Use Case 2; Desired tuning state |
| ⋮ |
| Band 1; Use Case n; Desired tuning state |
| Band 2; Use Case 1; Desired tuning state |
| Band 2; Use Case 2; Desired tuning state |
| ⋮ |
| Band 2; Use Case n; Desired tuning state |
| |
| Band N; Use Case 1; Desired tuning state |
| Band N; Use Case 2; Desired tuning state |
| ⋮ |
| Band N; Use Case n; Desired tuning state |

METHODS AND APPARATUS FOR TUNING A COMMUNICATION DEVICE

FIELD OF THE DISCLOSURE

The subject disclosure relates to methods and apparatus for tuning a communication device.

BACKGROUND

Cellular communication devices such as cellular telephones, tablets, and laptops can support multi-cellular access technologies, peer-to-peer access technologies, personal area network access technologies, and location receiver access technologies, which can operate concurrently. Cellular communication devices have also integrated a variety of consumer features such as MP3 players, color displays, gaming applications, cameras, and other features. Cellular communication devices can be required to communicate at a variety of frequencies, and in some instances are subjected to a variety of physical and functional use conditions.

BRIEF DESCRIPTION OF THE DRAWINGS

Reference will now be made to the accompanying drawings, which are not necessarily drawn to scale, and wherein:

FIG. 7 depicts an illustrative embodiment of a look-up table utilized by the communication device of FIG. 1 for controlling tunable reactive elements utilized by the communication device;

DETAILED DESCRIPTION

The subject disclosure describes, among other things, illustrative embodiments for tuning a communication device. Other embodiments are described by the subject disclosure.

One embodiment of the subject disclosure includes a communication device having an antenna, a tunable circuit having a variable reactive impedance, a memory storing computer instructions, a processor coupled to the memory, the tunable circuit, and the antenna. The processor, responsive to executing the computer instructions, can perform operations including initiating a mode of operation of the communication device, measuring a signal to determine an adverse state caused by the mode of operation of the communication device, determining a tuning state from the signal, tuning the tunable circuit according to the tuning state to compensate for the adverse state, storing the tuning state in a look-up table, detecting a reinitiating of the mode of operation of the communication device, retrieving the tuning state from the look-up table, and tuning the tunable circuit according to the tuning state retrieved from the look-up table.

One embodiment of the subject disclosure includes a computer-readable storage medium having computer instructions, which when executed by a processor, cause the processor to perform operations, including initiating a mode of operation of a communication device, measuring a signal to determine an adverse effect on one or more performance metrics of the communication device, determining a tuning state from the signal, tuning a circuit having a variable reactance according to the tuning state, storing in a memory the tuning state, detecting a reoccurrence of the mode of operation of the communication device, retrieving the tuning state from the memory, and tuning the circuit according to the tuning state retrieved from the memory.

One embodiment of the subject disclosure includes a method for initiating, by a communication device comprising a processor, a mode of operation of the communication device, measuring, by the communication device, a signal to determine an adverse operational effect on the communication device, determining, by the communication device, a tuning state from the signal to compensate for the adverse operational effect, tuning, by the communication device, a circuit of the communication device having a variable reactance according to the tuning state, storing, by the communication device, the tuning state in a memory of the communication device, and tuning, by the communication device, the circuit according to the tuning state retrieved from the memory responsive to detecting a reoccurrence of the mode of operation of the communication device.

Figure 1:
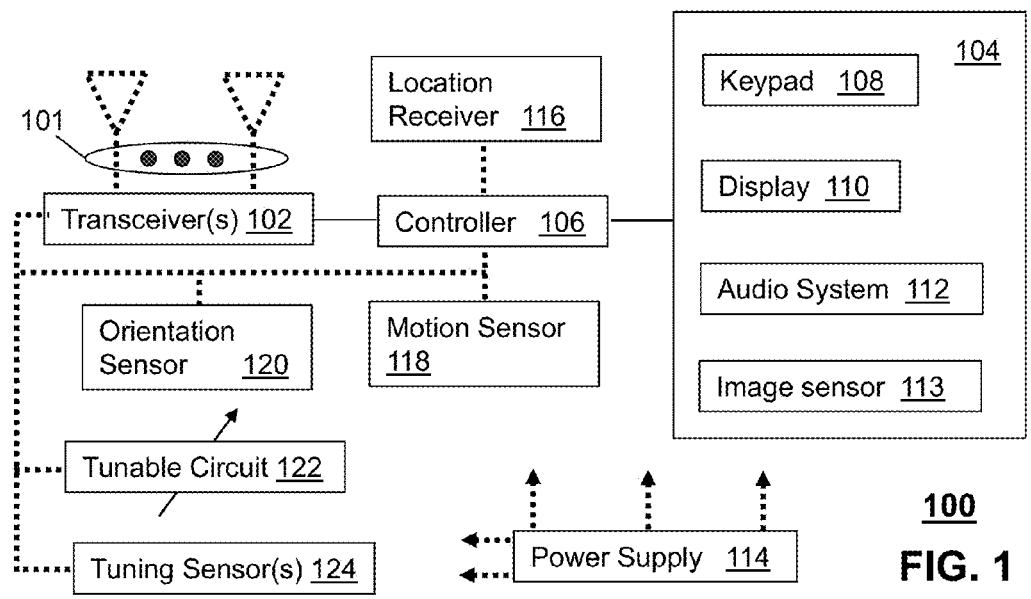
FIG. 1 depicts an illustrative embodiment of a communication device.

FIG. 1 depicts an illustrative embodiment of a communication device 100. The communication device 100 can comprise one or more transceivers 102 coupled to one or more antennas 101, each transceiver having transmitter and receiver sections (herein transceiver 102 or transceivers 102), a tunable circuit 122, one or more tuning sensors 124, a user interface (UI) 104, a power supply 114, a location receiver 116, a motion sensor 118, an orientation sensor 120, and a controller 106 for managing operations thereof. The transceiver 102 can support short-range or long-range wireless access technologies such as Bluetooth, ZigBee, Wireless Fidelity (WiFi), Digital Enhance Cordless Telecommunications (DECT), or cellular communication technologies, just to mention a few.

Cellular technologies can include, for example, Global System for Mobile (GSM), Code Division Multiple Access (CDMA), Time Division Multiple Access (TDMA), Universal Mobile Telecommunications (UMTS), World interoperability for Microwave (WiMAX), Software Defined Radio (SDR), Long Term Evolution (LTE), as well as other next generation wireless communication technologies as they arise. The transceiver 102 can also be adapted to support circuit-switched wireline access technologies such as Public Switched Telephone Network (PSTN), packet-switched wireline access technologies such as TCP/IP, Voice over IP—VoIP, etc., or combinations thereof.

The tunable circuit 122 can comprise variable reactive elements such as variable capacitors, variable inductors, or combinations thereof that are tunable with digital and/or analog bias signals. The tunable circuit 122 can represent a tunable matching network coupled to the antenna 101 to compensate for a change in impedance of the antenna 101, a compensation circuit to compensate for mutual coupling in a multi-antenna system, an amplifier tuning circuit to control operations of an amplifier of the transceiver 102, a filter tuning circuit to alter a pass band of a filter used by the transceiver 102, and so on.

Figure 2:
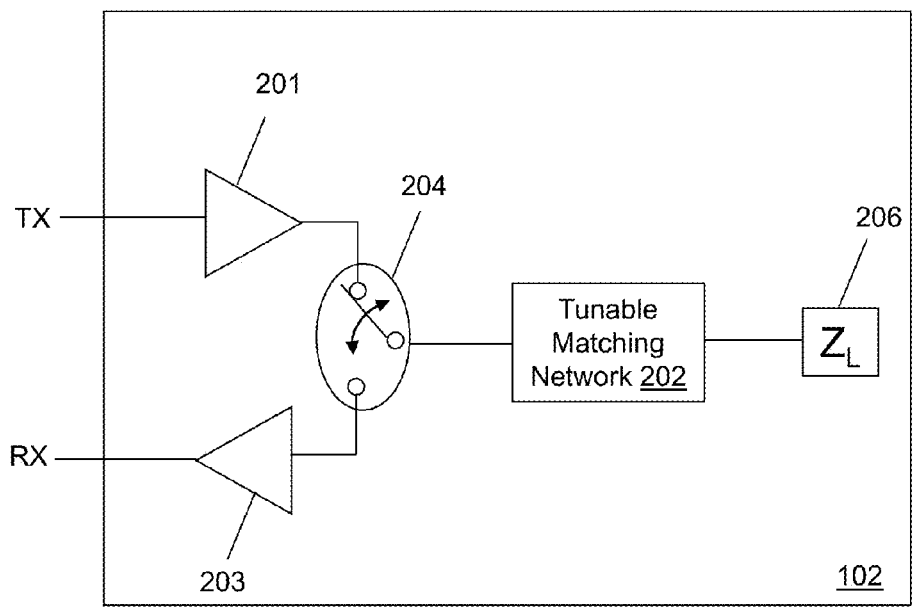
FIG. 2 depicts an illustrative embodiment of a portion of a transceiver of the communication device of FIG. 1.

The tuning sensors 124 can be placed at any stage of the transceiver 102 such as, for example, before or after a matching network 202, and/or at a power amplifier 201 as shown in FIG. 2. The tuning sensors 124 can utilize any suitable sensing technology such as directional couplers, voltage dividers, or other sensing technologies to measure signals at any stage of the transceiver 102. The digital samples of the measured signals can be provided to the controller 106 by way of analog-to-digital converters included in the tuning sensors 124. Data provided to the controller 106 by the tuning sensors 124 can be used to measure, for example, transmit power, transmitter efficiency, receiver sensitivity, power consumption of the communication device 100, frequency band selectivity by adjusting filter passbands, linearity and efficiency of power amplifiers, specific absorption rate (SAR) requirements, and so on. The controller 106 can be configured to execute one or more tuning algorithms to determine desired tuning states of the tunable circuit 122 based on the foregoing measurements.

The UI 104 can include a depressible or touch-sensitive keypad 108 with a navigation mechanism such as a roller ball, a joystick, a mouse, or a navigation disk for manipulating operations of the communication device 100. The keypad 108 can be an integral part of a housing assembly of the communication device 100 or an independent device operably coupled thereto by a tethered wireline interface (such as a USB cable) or a wireless interface supporting, for example, Bluetooth. The keypad 108 can represent a numeric keypad commonly used by phones, and/or a QWERTY keypad with alphanumeric keys. The UI 104 can further include a display 110 such as monochrome or color LCD (Liquid Crystal Display), OLED (Organic Light Emitting Diode) or other suitable display technology for conveying images to an end user of the communication device 100. In an embodiment where the display 110 is touch-sensitive, a portion or all of the keypad 108 can be presented by way of the display 110 with navigation features.

The display 110 can use touch screen technology to also serve as a user interface for detecting user input. As a touch screen display, the communication device 100 can be adapted to present a user interface with graphical user interface (GUI) elements that can be selected by a user with a touch of a finger. The touch screen display 110 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 110 can be an integral part of the housing assembly of the communication device 100 or an independent device communicatively coupled thereto by a tethered wireline interface (such as a cable) or a wireless interface.

The UI 104 can also include an audio system 112 that utilizes audio technology for conveying low volume audio (such as audio heard in proximity of a human ear) and high volume audio (such as speakerphone for hands free operation). The audio system 112 can further include a microphone for receiving audible signals of an end user. The audio system 112 can also be used for voice recognition applications. The UI 104 can further include an image sensor 113 such as a charged coupled device (CCD) camera for capturing still or moving images.

The power supply 114 can utilize common power management technologies such as replaceable and rechargeable batteries, supply regulation technologies, and/or charging system technologies for supplying energy to the components of the communication device 100 to facilitate long-range or short-range portable applications. Alternatively, or in combination, the charging system can utilize external power sources such as DC power supplied over a physical interface such as a USB port or other suitable tethering technologies.

The location receiver 116 can utilize location technology such as a global positioning system (GPS) receiver capable of assisted GPS for identifying a location of the communication device 100 based on signals generated by a constellation of GPS satellites, which can be used for facilitating location services such as navigation. The motion sensor 118 can utilize motion sensing technology such as an accelerometer, a gyroscope, or other suitable motion sensing technology to detect motion of the communication device 100 in three-dimensional space. The orientation sensor 120 can utilize orientation sensing technology such as a magnetometer to detect the orientation of the communication device 100 (north, south, west, and east, as well as combined orientations in degrees, minutes, or other suitable orientation metrics).

The communication device 100 can use the transceiver 102 to also determine a proximity to or distance to cellular, WiFi, Bluetooth, or other wireless access points by sensing techniques such as utilizing a received signal strength indicator (RSSI) and/or signal time of arrival (TOA) or time of flight (TOF) measurements.

The controller 106 can utilize computing technologies such as a microprocessor, a digital signal processor (DSP), and/or a video processor with associated storage memory such as Flash, ROM, RAM, SRAM, DRAM or other storage technologies for executing computer instructions, controlling, and processing data supplied by the aforementioned components of the communication device 100.

Other components not shown in FIG. 1 can be added to the communication device 100. For example, the communication device 100 can include a slot for inserting or removing an identity module such as a Subscriber Identity Module (SIM) card. SIM cards can be used for identifying and registering subscriber services, executing computer programs, storing subscriber data, and so forth.

The communication device 100 as described herein can operate with more or less of the circuit components shown in FIG. 1. It is further noted that communication device 100 be an integral part of consumer or industrial devices such as cellular phones, computers, laptops, tablets, utility meters, telemetry measurement devices, and so on.

FIG. 2 depicts an illustrative embodiment of a portion of the wireless transceiver 102 of the communication device 100 of FIG. 1. In GSM applications, the transmit and receive portions of the transceiver 102 can include amplifiers 201, 203 coupled to a tunable matching network 202 that is in turn coupled to an impedance load 206. The impedance load 206 in the present illustration can be an antenna as shown in FIG. 1 (herein antenna 206). A transmit signal in the form of a radio frequency (RF) signal (TX) can be directed to the amplifier 201 which amplifies the signal and directs the amplified signal to the antenna 206 by way of the tunable matching network 202 when switch 204 is enabled for a transmission session. The receive portion of the transceiver 102 can utilize a pre-amplifier 203 which amplifies signals received from the antenna 206 by way of the tunable matching network 202 when switch 204 is enabled for a receive session. Other configurations of FIG. 2 are possible for other types of cellular access technologies such as CDMA, UMTS, LTE, and so forth. These undisclosed configurations are applicable to the subject disclosure.

Figure 3:
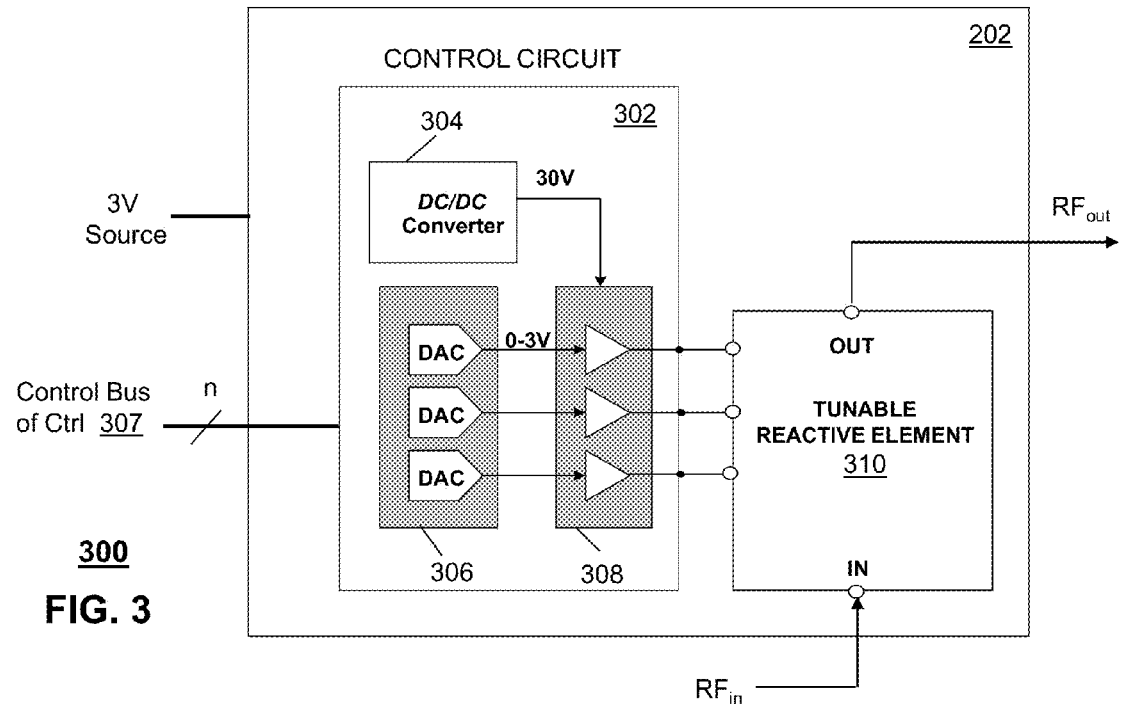
FIGS. 3-6 depict illustrative embodiments of a tunable matching network of the transceiver of FIG. 2.
Figure 4:
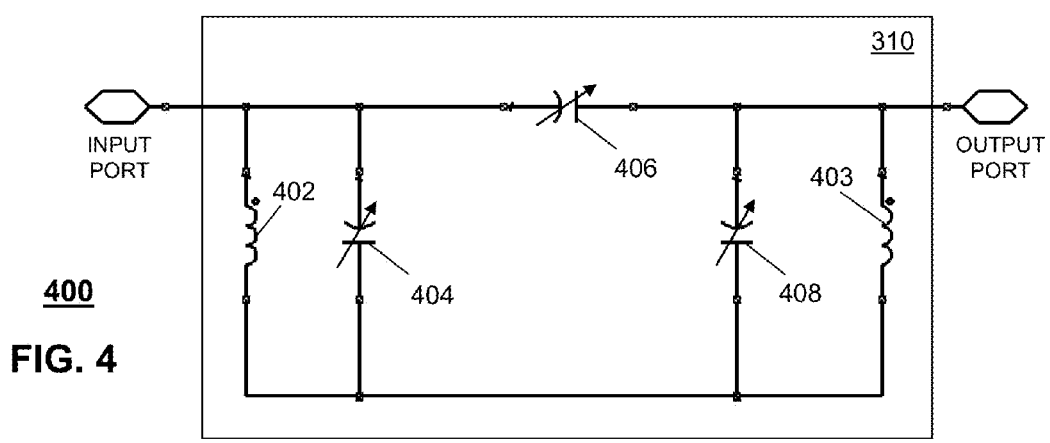

FIGS. 3-4 depict illustrative embodiments of the tunable matching network 202 of the transceiver 102 of FIG. 2. In one embodiment, the tunable matching network 202 can comprise a control circuit 302 and a tunable reactive element 310. The control circuit 302 can comprise a DC-to-DC converter 304, one or more digital to analog converters (DACs) 306 and one or more corresponding buffers 308 to amplify the voltage generated by each DAC. The amplified signal can be fed to one or more tunable reactive components 404, 406 and 408 such as shown in FIG. 4, which depicts a possible circuit configuration for the tunable reactive element 310. In this illustration, the tunable reactive element 310 includes three tunable capacitors 404-408 and two inductors 402-403 with a fixed inductance. Circuit configurations such as "Tee", "Pi", and "L" configurations for a matching circuit are also suitable configurations that can be used in the subject disclosure.

The tunable capacitors 404-408 can each utilize technology that enables tunability of the reactance of the component. One embodiment of the tunable capacitors 404-408 can utilize voltage or current tunable dielectric materials. The tunable dielectric materials can utilize, among other things, a composition of barium strontium titanate (BST). In another embodiment, the tunable reactive element 310 can utilize semiconductor varactors, or micro-electromechanical systems (MEMS) technology capable of mechanically varying the dielectric constant of a capacitor. Other present or next generation methods or material compositions that result in a voltage or current tunable reactive element are applicable to the subject disclosure for use by the tunable reactive element 310 of FIG. 3.

The DC-to-DC converter 304 can receive a DC signal such as 3 volts from the power supply 114 of the communication device 100 in FIG. 1. The DC-to-DC converter 304 can use technology to amplify a DC signal to a higher range (e.g., 30 volts) such as shown. The controller 106 can supply digital signals to each of the DACs 306 by way of a control bus 307 of "n" or more wires or traces to individually control the capacitance of tunable capacitors 404-408, thereby varying the collective reactive impedance of the tunable matching network 202. The control bus 307 can be implemented with a two-wire serial bus technology such as a Serial Peripheral Interface (SPI) bus (referred to herein as SPI bus 307). With an SPI bus 307, the controller 106 can transmit serialized digital signals to configure each DAC in FIG. 3. The control circuit 302 of FIG. 3 can utilize digital state machine logic to implement the SPI bus 307, which can direct digital signals supplied by the controller 106 to the DACs to control the analog output of each DAC, which is then amplified by buffers 308. In one embodiment, the control circuit 302 can be a stand-alone component coupled to the tunable reactive element 310. In another embodiment, the control circuit 302 can be integrated in whole or in part with another device such as the controller 106.

Although the tunable reactive element 310 is shown in a unidirectional fashion with an RF input and RF output, the RF signal direction is illustrative and can be interchanged. Additionally, either port of the tunable reactive element 310 can be connected to a feed point of the antenna 206, a structural element of the antenna 206 in an on-antenna configuration, or between antennas for compensating mutual coupling when diversity antennas are used, or when antennas of differing wireless access technologies are physically in close proximity to each other and thereby are susceptible to mutual coupling. The tunable reactive element 310 can also be connected to other circuit components of a transmitter or a receiver section such as filters, amplifiers, and so on, to control operations thereof.

Figure 6:
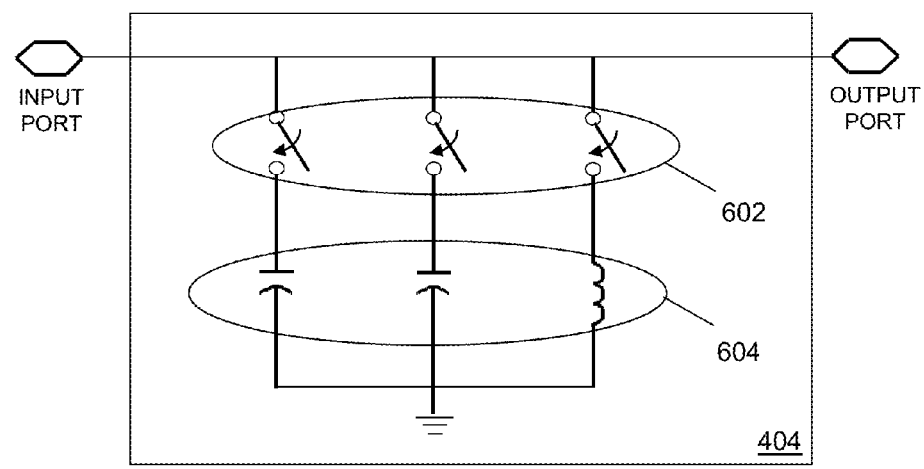

In another embodiment, the tunable matching network 202 of FIG. 2 can comprise a control circuit 502 in the form of a decoder and a tunable reactive element 504 comprising switchable reactive elements such as shown in FIG. 6. In this embodiment, the controller 106 can supply the control circuit 402 signals via the SPI bus 307, which can be decoded with Boolean or state machine logic to individually enable or disable the switching elements 602. The switching elements 602 can be implemented with semiconductor switches, MEMS, or other suitable switching technology. By independently enabling and disabling the reactive elements 607 (capacitor or inductor) of FIG. 6 with the switching elements 602, the collective reactive impedance of the tunable reactive element 504 can be varied by the controller 106.

Figure 5:
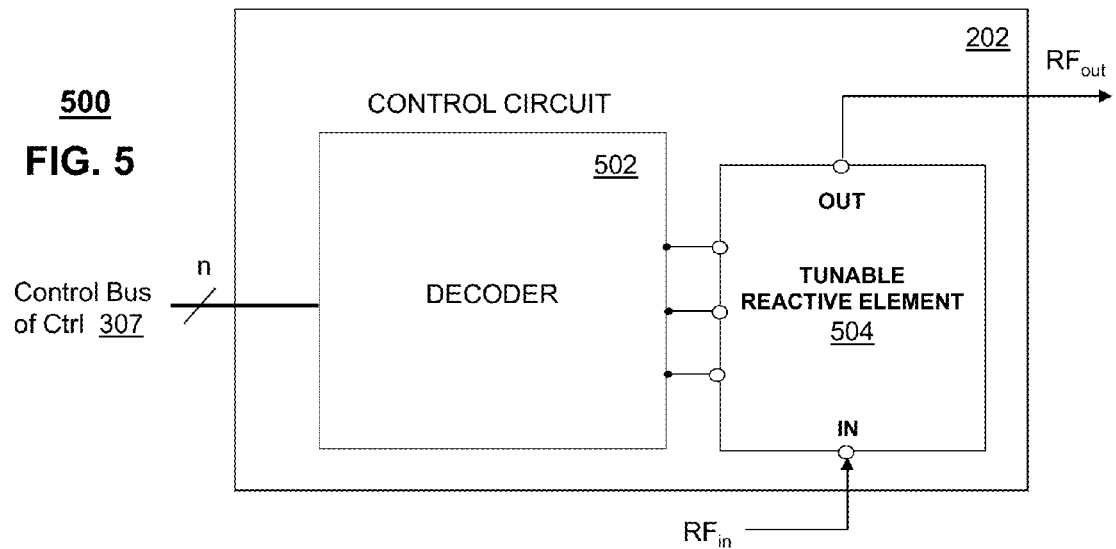

The tunable reactive elements 310 and 504 of FIGS. 3 and 5, respectively, can be used with various circuit components of the transceiver 102 to enable the controller 106 to manage performance factors such as, for example, but not limited to, transmit power, transmitter efficiency, receiver sensitivity, power consumption of the communication device 100, frequency band selectivity by adjusting filter passbands, linearity and efficiency of power amplifiers, SAR requirements, among other operational parameters.

Figure 8:
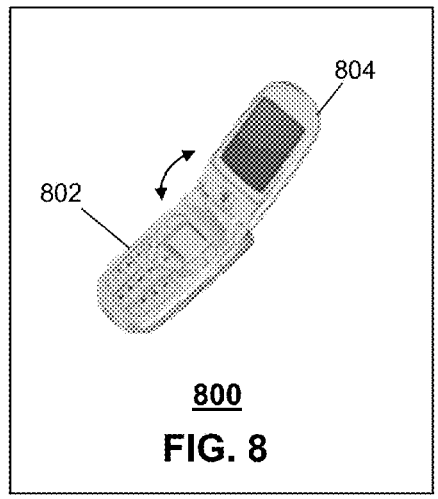
FIGS. 8-11 depict illustrative physical and operational use cases of a communication device.

FIG. 7 depicts an illustration of a look-up table stored in memory, which can be indexed by the controller 106 of the communication device 100 of FIG. 1 according to physical and/or functional use cases of the communication device 100. A physical use case can represent a physical state of the communication device 100, while a functional use case can represent an operational state of the communication device 100. For example, for a flip phone 800 of FIG. 8, an open flip can represent one physical use case, while a closed flip can represent another physical use case. In a closed flip state (i.e., bottom and top flips 802-804 are aligned), a user is likely to have his/her hands surrounding the top flip 802 and the bottom flip 804 while holding the phone 800, which can result in one range of load impedances experienced by an internal or retrievable antenna (not shown) of the phone 800. The range of load impedances of the internal or retrievable antenna can be determined by empirical analysis and while the communication device is in operation by a consumer as will be described below.

With the flip open a user is likely to hold the bottom flip 802 with one hand while positioning the top flip 804 near the user's ear when an audio system of the phone 800, such audio system 112 of FIG. 1, is set to low volume, and voice channel is active. If, on the other hand, the audio system 112 is in speakerphone mode, it is likely that the user is positioning the top flip 804 away from the user's ear. In these arrangements, different ranges of load impedances can be experienced by the internal or retrievable antenna, which can be analyzed empirically. The low and high volume states of the audio system 112, as well as, a determination that a voice channel is active illustrates varying functional use cases.

Figure 9:
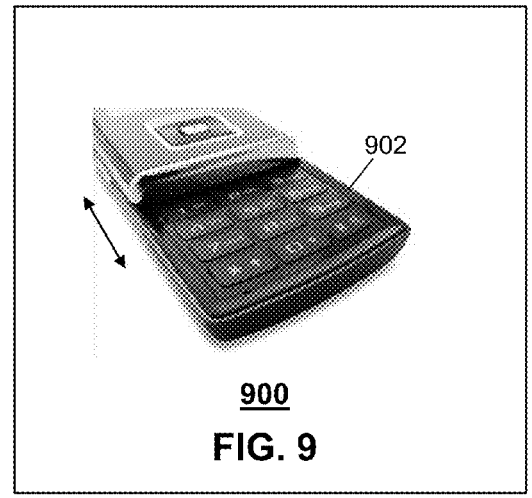
Figure 10:
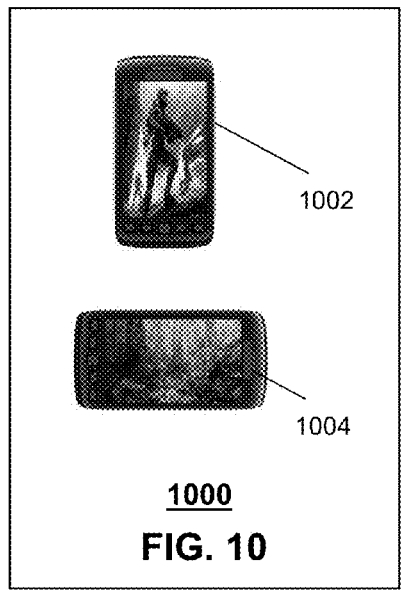
Figure 11:
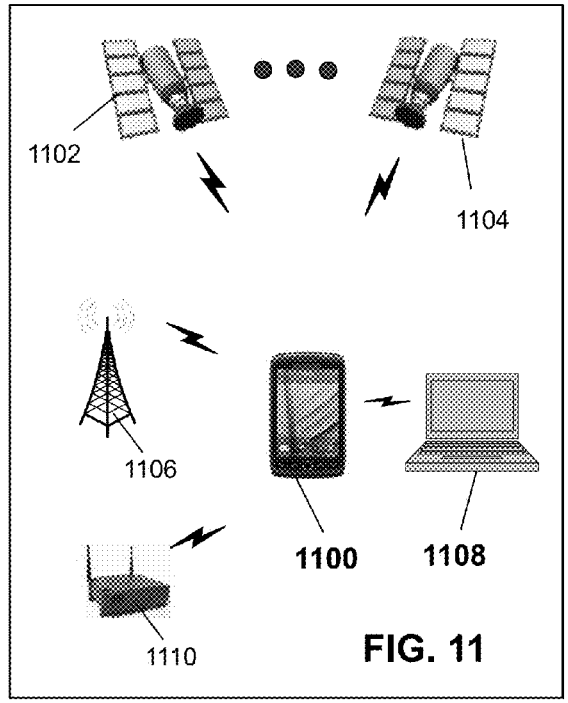

For a phone 900 with a slideable keypad 904 (illustrated in FIG. 9), the keypad in an outward position can present one range of load impedances of an internal antenna, while the keypad in a hidden position can present another range of load impedances, each of which can be analyzed empirically and while a consumer is operating the communication device. For a smartphone 1000 (illustrated in FIG. 10) presenting a video game, an assumption can be made that the user is likely to hold the phone away from the user's ear in order to view the game. Placing the smartphone 1000 in a portrait position 1002 can represent one physical and operational use case, while utilizing the smartphone 1000 in a landscape position 1004 presents another physical and operational use case.

The number of hands and fingers used in the portrait mode may be determined by the particular type of game being played by the user. For example, a particular video game may require a user interface where a single finger in portrait mode may be sufficient for controlling the game. In this scenario, it may be assumed that the user is holding the smartphone 1000 in one hand in portrait mode and using a finger with the other. By empirical analysis, or by measurements when the communication device is in use by a consumer, a possible range of impedances of the internal antenna(s) of the communication device can be determined when using the video game in portrait mode. Similarly, if the video game selected has a user interface that is known to require two hands in landscape mode, another estimated range of impedances of the internal antenna can be determined.

A multimode phone 1100 capable of facilitating multiple access technologies such as GSM, CDMA, LTE, WiFi, GPS, and/or Bluetooth in two or more combinations can provide additional insight into possible ranges of impedances experienced by two or more internal antennas of the multimode phone 1100. For example, a multimode phone 1100 that provides GPS services by processing signals received from a constellation of satellites 1102, 1104 can be empirically analyzed when other access technologies are also in use. Suppose, for instance, that while navigation services are enabled, the multimode phone 1100 is facilitating voice communications by exchanging wireless messages with a cellular base station 1106. In this state, an internal antenna of the GPS receiver may be affected by a use case of a user holding the multimode phone 1100 (e.g., near the user's ear or away from the user's ear). The effect on the GPS receiver antenna and the GSM antenna by the user's hand position can be determined.

Suppose in another scenario that the antenna of a GSM transceiver is in close proximity to the antenna of a WiFi transceiver. Further assume that the GSM frequency band used to facilitate voice communications is near the operational frequency of the WiFi transceiver. Also assume that a use case for voice communications may result in certain physical states of the multimode phone 1100 (e.g., slider out), which can result in a probable hand position of the user of the multimode phone 1100. Such a physical and functional use case can affect the impedance range of the antenna of the WiFi transceiver as well as the antenna of the GSM transceiver.

A close proximity between the WiFi and GSM antennas and the near operational frequency of the antennas may also result in cross-coupling between the antennas. Mutual or cross-coupling under these circumstances can be measured empirically. Similarly, empirical measurements of the impedances of other internal antennas can be measured for particular physical and functional use configurations when utilizing Bluetooth, WiFi, Zigbee, or other access technologies in peer-to-peer communications with another communication device 1108 or with a wireless access point 1110. In diversity designs such as multiple-input and multiple output (MIMO) antennas, physical and functional use cases of a communication device can be measured to determine how best to configure a tunable compensation circuit 122 such as shown in FIG. 1.

The number of physical and functional use cases of a communication device 100 can be substantial when accounting for combinations of access technologies, frequency bands, antennas of different access technologies, antennas configured for diversity designs, and so on. These combinations, however, can be analyzed to determine load impedances of the antenna(s), mutual coupling between them, and the effects on transmitter and receiver performance metrics. Mitigation strategies to reduce mutual coupling, counter the effect of varying load impedances, and to improve other performance metrics of the transceiver 102 can also be determined. The measured data collected and corresponding mitigation strategies can be recorded in the look-up table of FIG. 7 and indexed according to combinations of physical and functional use cases detected by the communication device 100. The information stored in the look-up table can be used in open-loop RF tuning applications to initialize tunable circuit components of the transceiver 102, as well as, tuning algorithms that control operational aspects of the tunable circuit components.

Figure 12:
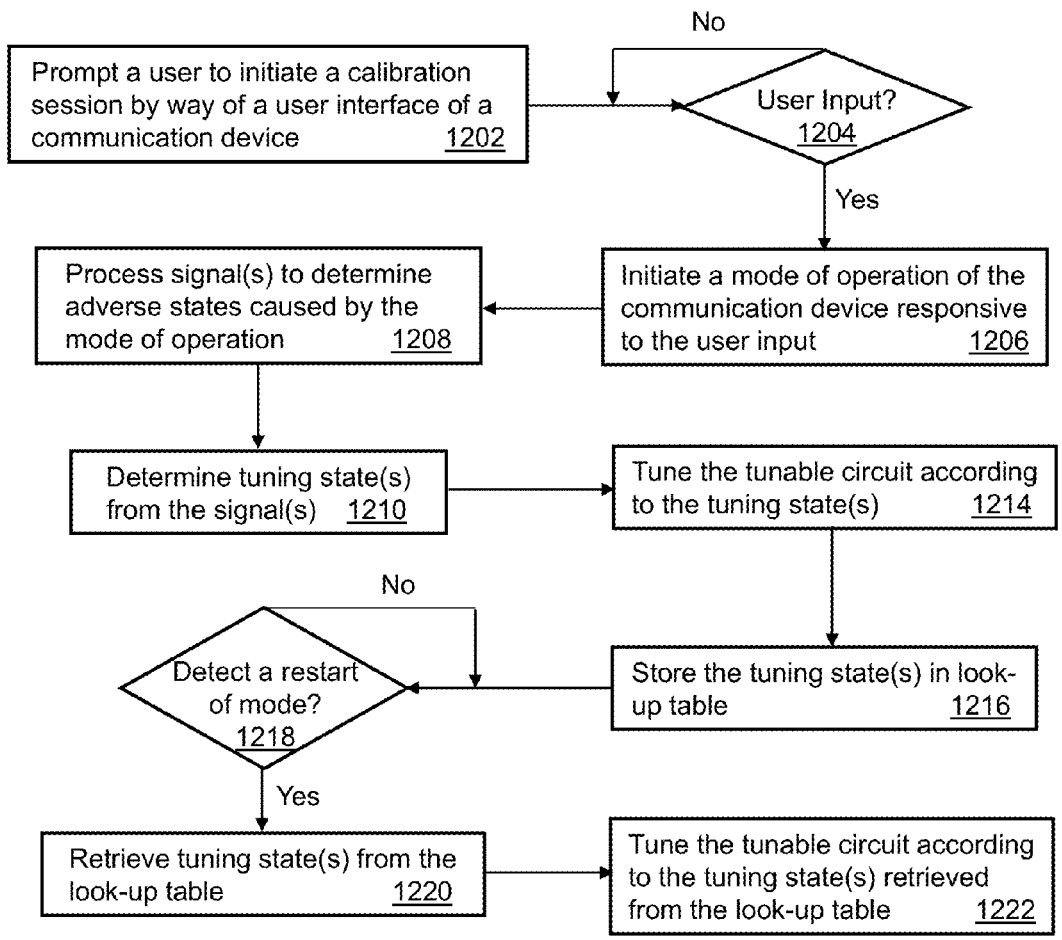
FIG. 12 depicts an exemplary method that can be used for tuning components of the communication device of FIG. 1.

FIG. 12 depicts an illustrative method 1200 that can be used in portions of the devices of FIGS. 1-6. Method 1200 can begin with step 1202 in which the controller 106 of the communication device 100 can be adapted to prompt a user to initiate a calibration session by way of a user interface 104 of the communication device 100. The prompt can be audible, visual, or a combination thereof. The calibration process can be automatically initiated such as a first power-on sequence of the communication device 100 after it is purchased, or calibration can be a periodic feature that is invoked at different times such as, for example, when purchasing a new software application, or when invoking new features of the communication device 100, or combinations thereof. The prompt presented by way of the user interface 104 can request that the user invoke one or more modes of operation of the communication device 100 to test for adverse effects.

The mode of operation of the communication device 100 can include a data communication session (e.g., 3G or 4G session), a voice communication session (GSM, UMTS, or CDMA session), an execution of a software application (e.g., a video game, location services, navigation services, etc.), or combinations thereof. The mode of operation of the communication device 100 can result in combinations of physical and functional use cases as previously described by way of illustration of FIGS. 8-11. If user input invoking the requested mode is detected in step 1204, the communication device 100 proceeds to step 1206 where it initiates the requested mode. At step 1208, the controller 106 can receive signals from the tuning sensors 124 and process the signals to determine adverse states caused by the initiated mode of operation of the communication device 100.

An adverse state can include, for example, detecting a change in impedance of the antenna 101 from a reflection coefficient determined from one of the measured signals resulting in a mismatch between the tunable matching network 202 and the load impedance 206 (i.e., the antenna 101). Another adverse state can include measuring by way of the tuning sensors 124 backscattering current from one of the antennas 101 indicating that there is mutual coupling between multiple antennas. Further adverse effects can include detecting an undesirable efficiency or linearity of an amplifier based on signals measured by the tuning sensors 124. Adverse effects can also include an unexpected increase in power consumption, or other effects that are measurable and controllable.

Based on the adverse states detected in step 1208, the controller 106 can determined at step 1210 from the measured signals and corresponding adverse states one or more tuning states that can be used to program the tunable circuit 122, and thereby compensate for the adverse states. For example, the controller 106 can determine from a measured reflection coefficient a new tuning state (i.e., new impedance) of the tunable matching network 202 to more closely match the present impedance of the antenna 101. Similarly, based on a measure of efficiency or linearity, the controller 106 can determine new tuning states of a power tuning circuit (not shown) of amplifier 201 as mentioned earlier such as, for example, setting bias voltages, supply voltage settings, and/or a new impedance state of a variable reactive circuit coupled to the amplifier 201 to singly or collectively improve the efficiency and/or linearity of the amplifier 201. Other tuning states can be determined for other tunable devices such as tunable bandpass filters, and so on.

At step 1214, the controller 106 proceeds to tune the tunable circuit 122 by supplying digital and/or analog signals to the tunable circuit 122 to establish the tuning states determined in step 1210. At step 1216, the controller 106 can store the tuning states determined at step 1210 in the look-up table of FIG. 7 according to the physical and functional use cases detected in the mode of operation of the communication device 100 initiated at step 1206. Once recorded in the look-up table, the controller 106 can monitor at step 1218 future reoccurrences of the mode of operation that was just calibrated. If a reoccurrence of the same mode is detected, the controller 106 proceeds to step 1220 where it retrieves the tuning states from the look-up table according to this mode, and tunes the tunable circuit 122 according to the retrieved tuning states at step 1222. In one embodiment, step 1220 can be performed without performing 1208 to measure adverse states. In another embodiment, the controller 106 can be configured to periodically, or each time there's a reoccurrence of a mode previously calibrated, reinitiate step 1208 after tuning the tunable circuit 122 with the tuning states retrieved from the look-up table to determine if recalibration is necessary. If the controller 106 determines that an adverse state is present, the controller 106 can be configured to repeat steps 1202-1216.

Steps 1218-1222 provide a rapid approach to counteracting adverse effects on performance parameters of the communication device 100 before they happen. The calibration process described by method 1200 can be invoked for any number of modes of operation of the communication device 100. Method 1200 can also be adapted to store tuning states according to any number of modes of operation of the communication as they occur.

Upon reviewing the aforementioned embodiments, it would be evident to an artisan with ordinary skill in the art that said embodiments can be modified, reduced, or enhanced without departing from the scope of the claims described below. For example, method 1200 can be adapted to also perform closed-loop tuning. That is, after the retrieved tuning states have been used to tune the tunable circuit 122, the controller 106 can be adapted to continuously measure the operational parameters of the communication device 100 by way of the tuning sensors 124 to fine-tune incremental adverse affects that cannot be mitigated by static tuning states.

Method 1200 can also be adapted to detect when a user of the communication device 100 installs a new software application, and can invoke the calibration process to further augment the tuning states stored in the look-up table. Method 1200 can also be configured to monitor use patterns of a user of the communication device 100, measure adverse effects and mitigation strategies that are predictable from such use patterns, and store additional tuning states in the look-up table to further mitigate adverse states of the communication device 100. Method 1200 can also be adapted to model adverse states and in some instances ascertain a mathematical model for tuning states that can be applied in real-time during a mode of operation of the communication device.

Other embodiments can be applied to the subject disclosure without departing from the scope of the claims described below.

It should be understood that devices described in the exemplary embodiments can be in communication with each other via various wireless and/or wired methodologies. The methodologies can be links that are described as coupled, connected and so forth, which can include unidirectional and/or bidirectional communication over wireless paths and/or wired paths that utilize one or more of various protocols or methodologies, where the coupling and/or connection can be direct (e.g., no intervening processing device) and/or indirect (e.g., an intermediary processing device such as a router).

Figure 13:
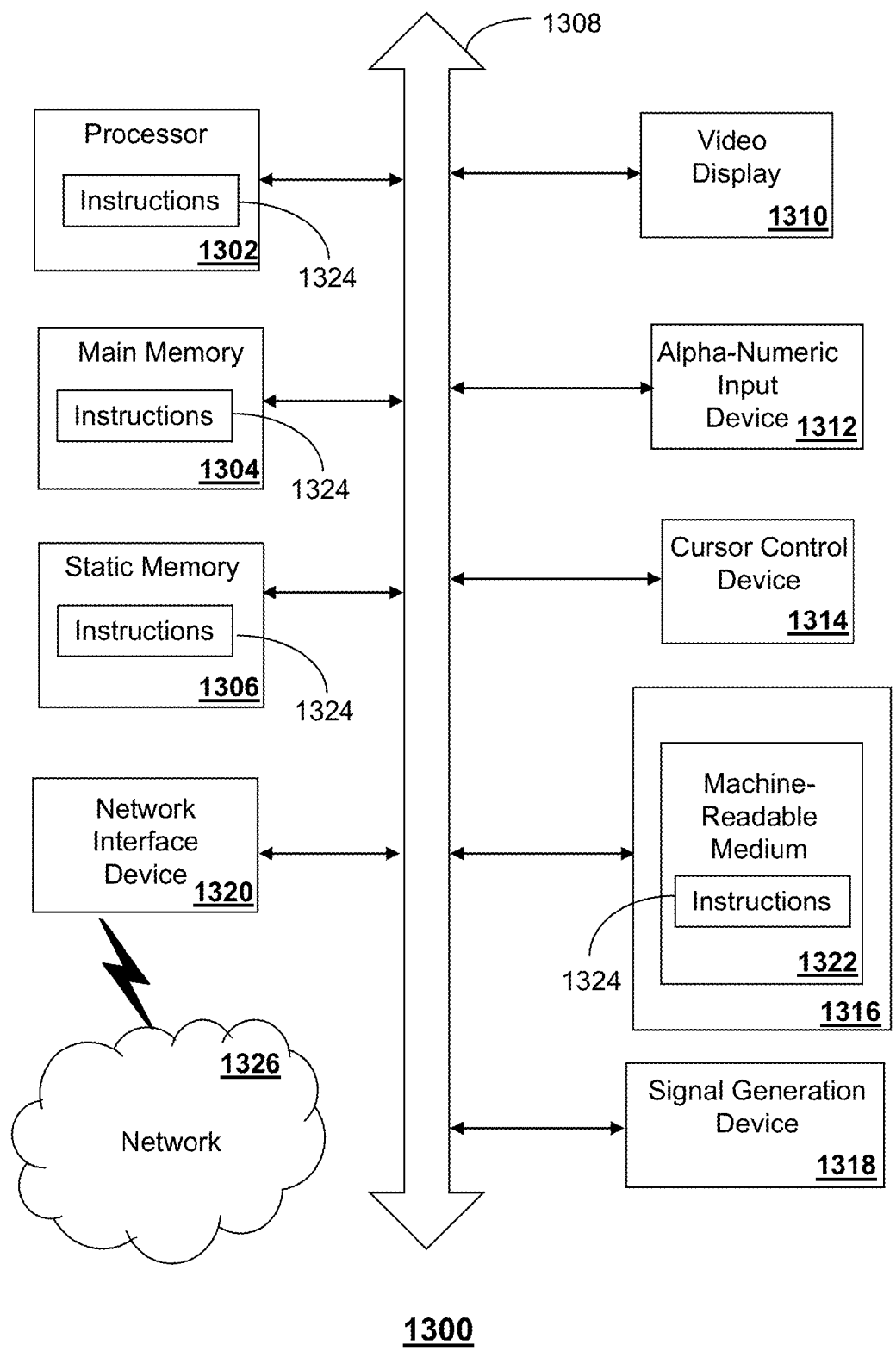
FIG. 13 depicts an illustrative diagrammatic representation of a machine in the form of a computer system within which a set of instructions, when executed, may cause the machine to perform any one or more of the methodologies disclosed herein.

FIG. 13 depicts an exemplary diagrammatic representation of a machine in the form of a computer system 1300 within which a set of instructions, when executed, may cause the machine to perform any one or more of the methods discussed above. One or more instances of the machine can operate, for example, as the communication device 100 of FIG. 1. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 1300 may include a processor (or controller) 1302 (e.g., a central processing unit (CPU), a graphics processing unit (GPU, or both), a main memory 1304 and a static memory 1306, which communicate with each other via a bus 1308. The computer system 1300 may further include a video display unit 1310 (e.g., a liquid crystal display (LCD), a flat panel, or a solid state display. The computer system 1300 may include an input device 1312 (e.g., a keyboard), a cursor control device 1314 (e.g., a mouse), a disk drive unit 1316, a signal generation device 1318 (e.g., a speaker or remote control) and a network interface device 1320.

The disk drive unit 1316 may include a tangible computer-readable storage medium 1322 on which is stored one or more sets of instructions (e.g., software 1324) embodying any one or more of the methods or functions described herein, including those methods illustrated above. The instructions 1324 may also reside, completely or at least partially, within the main memory 1304, the static memory 1306, and/or within the processor 1302 during execution thereof by the computer system 1300. The main memory 1304 and the processor 1302 also may constitute tangible computer-readable storage media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

While the tangible computer-readable storage medium 622 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth, WiFi, Zigbee), and long-range communications (e.g., WiMAX, GSM, CDMA, LTE) are contemplated for use by computer system 1300.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, are contemplated by the subject disclosure.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A communication device, comprising:
an antenna comprising an antenna feed point having an associated load impedance of the antenna;
a tunable circuit coupled to the antenna feed point and having a variable reactive impedance adjustable to compensate for a change in the load impedance of the antenna;
a tuning sensor in communication with the tunable circuit and providing a sensor signal based on a mode of operation of the communication device;
a memory that stores executable instructions; and
a processor coupled to the memory, the tuning sensor, the tunable circuit, and the antenna, wherein the processor, responsive to executing the instructions, performs operations comprising:
presenting a first prompt at a user interface of the communication device to calibrate the communication device; and
detecting user input at the user interface responsive to the first prompt;
initiating a mode of operation of the communication device responsive to the detecting of the user input;
measuring the sensor signal to determine an adverse state comprising the change in the load impedance of the antenna caused by the mode of operation of the communication device;
determining a tuning state based on the sensor signal;
tuning the tunable circuit according to the tuning state to compensate for the adverse state;
storing the tuning state in a look-up table indexed according to the mode of operation of the communication device;
detecting a reinitiating of the mode of operation of the communication device; retrieving, in response to the detecting of the reinitiating of the mode and without performing a sensor signal measurement, the tuning state from the look-up table based on the mode of operation of the communication device; and
tuning the tunable circuit according to the tuning state retrieved from the look-up table.

2. The communication device of claim 1, wherein the initiating of the mode of operation of the communication device comprises:
presenting a second prompt requesting an initiation of the mode of operation of the communication device;
detecting user input; and
initiating the mode of operation of the communication device responsive to detecting the user input, and
wherein the measuring the signal to determine the adverse state comprises using the tuning sensor.

3. The communication device of claim 1, wherein the adverse state comprises the change in the load impedance of the antenna, and
wherein the detecting of the reinitiating of the mode of operation of the communication device comprises detecting one of a physical configuration of the communication device, a function of the device, or both.

4. The communication device of claim 1, wherein the adverse state comprises a range of load impedances of the antenna, and wherein the determining of the tuning state comprises:
determining a reflection coefficient from the signal, wherein the reflection coefficient is indicative of the adverse state, corresponding to the range of load impedances of the antenna; and
determining the tuning state from the reflection coefficient to compensate for the range of load impedances of the antenna.

5. The communication device of claim 1, wherein the mode of operation of the communication device comprises a communication session.

6. The communication device of claim 5, wherein the communication session is one of a voice communication session or a data communication session.

7. The communication device of claim 5, wherein the communication session is one of a circuit-switched communication session or packet-switched communication session.

8. The communication device of claim 5, wherein the communication session conforms to a long term evolution communication protocol.

9. The communication device of claim 1, wherein the mode of operation of the communication device comprises an execution of a software application.

10. The communication device of claim 9, wherein the software application is a video game.

11. The communication device of claim 1, wherein the determining of the tuning state comprises:
determining a measure of a received signal strength indicator from the signal; and
determining the tuning state from the received signal strength indicator.

12. The communication device of claim 1, wherein the tunable circuit comprises a fixed reactive element controlled by a semiconductor device to produce a variable reactance.

13. The communication device of claim 1, wherein the tunable circuit comprises a fixed reactive element controlled by a micro-electro-mechanical systems device to produce a variable reactance.

14. The communication device of claim 1, wherein the tunable circuit comprises a variable reactive element controlled by a micro-electro-mechanical systems device to produce a variable reactance.

15. The communication device of claim 1, wherein the tunable circuit comprises a variable reactive element controlled by a bias signal that varies a dielectric constant of the variable reactive element to produce a variable reactance.

16. The communication device of claim 1, wherein the tunable circuit comprises one of a tunable matching network coupled to the antenna to compensate for the change in the load impedance of the antenna, a compensation circuit to compensate for mutual coupling between the antenna and another antenna of the communication device, an amplifier tuning circuit to control operations of an amplifier of the communication device, a filter tuning circuit to alter a pass band of a filter of the communication device, or combinations thereof.

17. The communication device of claim 1, wherein the signal is received from the antenna, and wherein the tuning of the tunable circuit according to the tuning state retrieved from the look-up table is performed without repeating the measuring of the signal to determine the adverse state.

18. The communication device of claim 1, wherein the communication device is one of a cellular telephone, a tablet, or a computer.

19. A tangible storage device, comprising executable instructions, which when executed by a processor, cause the processor to perform operations, comprising:
presenting a prompt at a user interface of a communication device to calibrate the communication device; and
detecting user input at the user interface responsive to the prompt;
identifying responsive to the detecting of the user input a mode of operation of the communication device in communication with an antenna;
measuring a signal to determine an adverse effect on a performance metric of the communication device, wherein the adverse effect comprises a change in a load impedance of the antenna, and wherein the signal comprises an indication of the change in load impedance of the antenna;
determining a tuning state based on the signal;
tuning a circuit having a variable reactance according to the tuning state to compensate for the change in the load impedance of the antenna;
storing in a memory the tuning state in association with the mode of operation of the communication device;
detecting a reoccurrence of the mode of operation of the communication device;
retrieving the tuning state from the memory based on the mode of operation of the communication device and without repeating of the measuring of the signal; and
tuning the circuit according to the tuning state retrieved from the memory.

20. The tangible storage device of claim 19, wherein the measuring the signal to determine the adverse effect comprises measuring the signal at any stage of a transceiver coupled to the antenna, and
wherein the signal comprises one of transmit power, transmitter efficiency, receiver sensitivity, power consumption, frequency band selectivity, linearity, efficiency of power amplifiers, or specific absorption rate requirements.

21. The tangible storage device of claim 19, wherein the circuit comprises one of a variable capacitor, a variable inductor, or combinations thereof, and wherein the measuring the signal to determine the adverse effect comprises using one of a directional coupler, a voltage divider, or a combination thereof.

22. The tangible storage device of claim 19, wherein the mode of operation of the communication device is one of a data communication session, a voice communication session, or execution of a software application.

23. A method, comprising:
presenting, by a communication device comprising a processor, a first prompt at a user interface of the communication device to calibrate the communication device; and
detecting, by the communication device, user input at the user interface responsive to the first prompt;
initiating, by the communication device, a mode of operation of the communication device in communication with a load impedance, wherein the initiating of the mode of operation is responsive to the detecting of the user input;

measuring, by the communication device, a signal to determine an adverse operational effect on the communication device, wherein the adverse effect comprises a change in the load impedance, and wherein the signal comprises an indication of the change in the load impedance;

determining, by the communication device, a tuning state based on the signal to compensate for the adverse operational effect;

tuning, by the communication device, a circuit of the communication device having a variable reactance according to the tuning state;

storing, by the communication device, the tuning state in a memory of the communication device, wherein the tuning state is retrievable from the memory based on the mode of operation of the communication device; and tuning, by the communication device, the circuit according to the tuning state retrieved from the memory responsive to detecting a reoccurrence of the mode of operation of the communication device and without using a tuning sensor.

24. The method of claim 23, wherein the initiating of the mode of operation of the communication device, comprises:

presenting, by the communication device, a second prompt at a user interface of the communication device to initiate a calibration process; and initiating, by the communication device, the mode of operation of the communication device responsive to detecting user input at the user interface.

\* \* \* \* \*